United States Patent
Wang et al.

(10) Patent No.: US 8,963,295 B2
(45) Date of Patent: Feb. 24, 2015

(54) SEMICONDUCTOR STRUCTURE WITH BERYLLIUM OXIDE

(71) Applicant: Tsinghua University, Beijing (CN)

(72) Inventors: Jing Wang, Beijing (CN); Renrong Liang, Beijing (CN); Lei Guo, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/816,164

(22) PCT Filed: Dec. 18, 2012

(86) PCT No.: PCT/CN2012/086875
§ 371 (c)(1),
(2) Date: Feb. 8, 2013

(87) PCT Pub. No.: WO2014/059733
PCT Pub. Date: Apr. 24, 2014

(65) Prior Publication Data
US 2014/0145314 A1    May 29, 2014

(30) Foreign Application Priority Data

Oct. 19, 2012   (CN) .......................... 2012 1 0401590

(51) Int. Cl.
| | | |
|---|---|---|
| *H01L 27/12* | (2006.01) | |
| *H01L 21/00* | (2006.01) | |
| *H01L 29/10* | (2006.01) | |
| *H01L 29/04* | (2006.01) | |
| *H01L 21/02* | (2006.01) | |
| *H01L 29/06* | (2006.01) | |
| *H01L 29/24* | (2006.01) | |
| *H01L 21/8238* | (2006.01) | |
| *H01L 21/027* | (2006.01) | |

(52) U.S. Cl.
CPC .......... *H01L 29/04* (2013.01); *H01L 21/02488* (2013.01); *H01L 21/02507* (2013.01); *H01L 29/06* (2013.01); *H01L 29/24* (2013.01); *H01L 21/02381* (2013.01); *H01L 21/02433* (2013.01); *H01L 21/0245* (2013.01); *H01L 21/02532* (2013.01); *H01L 21/823807* (2013.01); *H01L 21/0276* (2013.01)
USPC ........... 257/649; 257/347; 257/348; 257/349; 257/E21.129; 257/369; 438/149; 438/199; 438/479; 438/496

(58) Field of Classification Search
CPC ................................ H01L 29/06; H01L 29/24
USPC .................................................. 257/645–655
See application file for complete search history.

(56) References Cited

U.S. PATENT DOCUMENTS

| | | | | |
|---|---|---|---|---|
| 4,523,211 A | * | 6/1985 | Morimoto et al. | ............ 361/807 |
| 7,452,757 B2 | * | 11/2008 | Werkhoven et al. | ......... 438/149 |
| 2005/0104131 A1 | * | 5/2005 | Chidambarrao et al. | ..... 257/369 |

*Primary Examiner* — Wael Fahmy
*Assistant Examiner* — Nelson Garces
(74) *Attorney, Agent, or Firm* — Houtteman Law LLC

(57) ABSTRACT

A semiconductor structure with beryllium oxide is provided. The semiconductor structure comprises: a semiconductor substrate (100); and a plurality of insulation oxide layers (201, 202 ... 20x) and a plurality of single crystal semiconductor layers (301, 302 ... 30x) alternately stacked on the semiconductor substrate (100). A material of the insulation oxide layer (201) contacted with the semiconductor substrate (100) is any one of beryllium oxide, $SiO_2$, $SiO_xN_y$, and a combination thereof, a material of other insulation oxide layers (202 ... 20x) is single crystal beryllium oxide.

8 Claims, 1 Drawing Sheet

SEMICONDUCTOR STRUCTURE WITH BERYLLIUM OXIDE

CROSS-REFERENCE TO RELATED APPLICATION

This application claims priority to and benefits of Chinese Patent Application Serial No. 201210401590.X, filed with the State Intellectual Property Office of P. R. China on Oct. 19, 2012, the entire contents of which are incorporated herein by reference.

FIELD

The present disclosure relates to a semiconductor field, and more particularly to a semiconductor structure with beryllium oxide.

BACKGROUND

In a semiconductor field, a three dimensional structure technology is becoming a focus in order to fabricate a highly integrated chip. For instance, a memory chip with a multi-layer stack structure is an important technical trend in high density storage. For a fabrication of a device with the multi-layer stack structure, according to one method, firstly a semiconductor structure with a plurality of insulation dielectric layers and a plurality of single crystal semiconductor layers alternately stacked is formed, and then a device is formed on the single crystal semiconductor layer.

However, the fabrication of the semiconductor structure with a plurality of insulation dielectric layers and a plurality of single crystal semiconductor layers alternately stacked has not been well developed yet for decades. A main reason is that a common single crystal semiconductor material is difficult to lattice match with a conventional insulation dielectric material. A common method for forming a single crystal semiconductor film is an epitaxial growth. For the epitaxial growth of a high quality single crystal semiconductor film on the insulation dielectric, the insulation dielectric material may be required to not only have a single crystal structure, but also well lattice match with the single crystal semiconductor film. Taking a commonly used single crystal silicon as an example, most known insulation dielectric materials have an amorphous structure or lattice constant differences between these currently known insulation dielectric materials and silicon are large. For instance, although conventional insulation dielectric materials (such as $SiO_2$, $Si_3N_4$, $HfO_2$, $ZrO_2$ or $Al_2O_3$) may form single crystals, the lattice constant differences between them and the single crystal silicon are large. Many defects will be produced in the single crystal silicon film which is epitaxially grown on these single crystal dielectric layers, or even it is difficult to epitaxially grow the single crystal silicon film, thus resulting in a defective device formed on the single crystal silicon film.

In addition, with an increase of an integration density of semiconductor devices, heat dissipation will become a critical problem. Particularly, for a three dimensional logic device, a heat conductivity of an isolation dielectric filled between devices is required to be the larger the better so as to improve a performance of the logic device. However, the heat conductivity of a conventional insulation dielectric (such as $SiO_2$ or $SiO_xN_y$) is too poor to satisfy a heat dissipation requirement of a high density integrated semiconductor logic chip.

SUMMARY

The present disclosure is aimed to solve at least one of the problems, and particularly a semiconductor structure with a plurality of insulation dielectric layers and a plurality of single crystal semiconductor layers alternately stacked is provided. The semiconductor structure, which has advantages of a relative low crystal defect density and a relative large heat conductivity of an isolation dielectric, is used for fabricating a three dimensional semiconductor device with high performance and high integration density, and can satisfy a heat dissipation requirement of a high density semiconductor device.

According to an aspect of the present disclosure, a semiconductor structure with beryllium oxide is provided. The semiconductor structure comprises: a semiconductor substrate; and a plurality of insulation oxide layers and a plurality of single crystal semiconductor layers alternately stacked on the semiconductor substrate, in which a material of the insulation oxide layer contacted with the semiconductor substrate is any one of beryllium oxide, $SiO_2$, $SiO_xN_y$, and a combination thereof, a material of other insulation oxide layers is single crystal beryllium oxide.

In one embodiment, a material of the semiconductor substrate comprises single crystal Si, single crystal SiGe and single crystal Ge.

In one embodiment, a thickness of each insulation oxide layer is not less than 25 nm.

In one embodiment, a material of each single crystal semiconductor layer comprises any one of Si, Ge, SiGe, groups III-V compound semiconductor materials, and groups II-VI compound semiconductor materials and a combination thereof.

In one embodiment, each single crystal semiconductor layer comprises one or more sub-layers.

In one embodiment, at least one single crystal semiconductor layer is different from other single crystal semiconductor layers in material.

In one embodiment, at least one single crystal semiconductor layer is strained.

In one embodiment, at least one single crystal semiconductor layer is different from other single crystal semiconductor layers in degree of strain.

In one embodiment, at least one single crystal semiconductor layer is different from other single crystal semiconductor layers in type of strain.

In one embodiment, a surface of the semiconductor substrate is any crystal plane of (100), (110) and (111).

In one embodiment, each insulation oxide layer with the material of beryllium oxide and each single crystal semiconductor layer are formed by epitaxial growth.

The semiconductor structure with the beryllium oxide according to embodiment of the present disclosure at least has following advantages.

(1) The semiconductor structure with a plurality of insulation dielectric layers and a plurality of single crystal semiconductor layers alternately stacked is used for fabricating the three dimensional semiconductor device with high integration density to greatly increase an integration density of the device, and also to realize a three dimensional integration with different devices.

(2) The semiconductor structure may be formed by alternately epitaxially growing the single crystal semiconductor layer and the beryllium oxide. Both a beryllium oxide crystal and a conventional semiconductor material (such as Si, Ge, SiGe or GaAs) belong to a cubic system, meanwhile, a lattice constant of the single crystal silicon is expressed as a=b=5.43 Å, and a lattice constant of the single crystal beryllium oxide is expressed as a=b=2.70 Å which is about half of that of the single crystal silicon, that is, one unit cell of silicon crystal just matches with two unit cells of beryllium oxide crystal.

Thus silicon crystal and beryllium oxide crystal substantially lattice match with each other, which may obviously reduce a crystal defect in the semiconductor structure, and is helpful to form the semiconductor single crystal film on the single crystal beryllium oxide film by epitaxial growth, as well as to form the single crystal beryllium oxide film on the semiconductor single crystal film by epitaxial growth. Furthermore, it is favorable for a formation of high performance semiconductor devices on the semiconductor structure.

(3) By designing a composition and adjusting a content of each single crystal semiconductor layer, the lattice constant thereof may be slightly more than, slightly smaller than or equivalent to that of beryllium oxide crystal so as to control the type and degree of strain of the single crystal semiconductor film epitaxially grown on the single crystal beryllium oxide. For example, when a Si film is grown on the beryllium oxide crystal, the Si film is almost not strained; when a SiGe film is grown on the beryllium oxide crystal, because an atomic radius of Ge is bigger than that of Si, the SiGe film with a compressive stress of which a stress increasing with an increase of Ge content may be obtained; when a $Si_{1-y}C_y$, ($0 \leq y \leq 1$, where C is a substitution atom rather than an interstitial atom) film is grown on the beryllium oxide crystal, because an atomic radius of C is smaller than that of Si, the $Si_{1-y}C_y$ film with a tensile stress of which a stress increasing with an increase of C content may be obtained.

(4) The heat conductivity of the single crystal beryllium oxide is approximately equivalent to that of aluminium, and is much larger than that of a conventional oxide (such as $SiO_2$ or $SiO_xN_y$), thus evidently improving the heat dissipation of devices and enhancing a device performance accordingly.

(5) An energy gap of single crystal beryllium oxide is 10.6 eV, and a relative dielectric constant of single crystal beryllium oxide is 6.8, while a relative dielectric constant of $SiO_2$ is 3.9. Although the dielectric constant of beryllium oxide is higher than that of $SiO_2$, beryllium oxide has an excellent insulation property, and thus can be used as an insulation dielectric between two layers of semiconductor devices. In this case, a relative thicker beryllium oxide layer may be formed between the two layers of semiconductor devices to avoid an influence of high dielectric constant.

(6) A conventional epitaxy process (such as ALD (atom layer deposition), MOCVD (metal-organic chemical vapor deposition), UHVCVD (ultra-high vacuum chemical vapor deposition) or MBE (molecular beam epitaxy)) may be introduced to fabricate the semiconductor structure. These fabrication processes are compatible with conventional semiconductor fabrication processes, and simple to realize with low cost.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
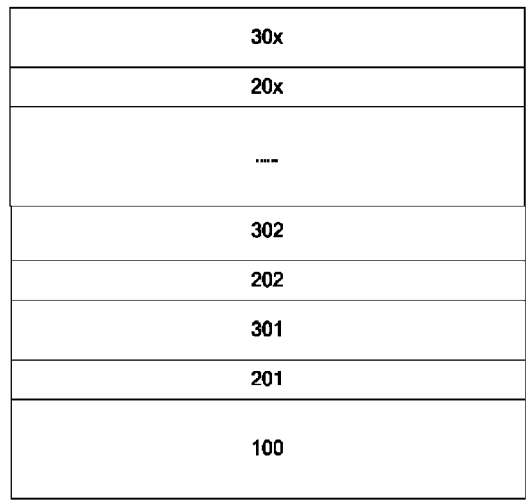
FIG. 1 is a cross-sectional view of a semiconductor structure with beryllium oxide according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operate in a particular orientation, and thus do not be construed to limit the present disclosure. Furthermore, except as otherwise indicated, "a plurality of" means two or more.

FIG. 1 is a cross-sectional view of a semiconductor structure with beryllium oxide according to an embodiment of the present disclosure. As shown in FIG. 1, the semiconductor structure comprises: a semiconductor substrate 100; and a plurality of insulation oxide layers 201, 202 . . . 20x and a plurality of single crystal semiconductor layers 301, 302 . . . 30x alternately stacked on the semiconductor substrate 100. A material of the insulation oxide layer 201 contacted with the semiconductor substrate 100 is any one of beryllium oxide, $SiO_2$, $SiO_xN_y$ and a combination thereof, a material of other insulation oxide layers (from 202 to 20x) is single crystal beryllium oxide. For a formation of a three dimensional device structure to increase an integration density, two or more layers of single crystal semiconductor layers are preferred. By forming a single crystal beryllium oxide layer on the single crystal semiconductor layer, because the single crystal beryllium oxide and single crystal Si lattice match with each other, a crystal defect in the semiconductor structure may be obviously reduced, especially a high quality Si film may be formed on the single crystal beryllium oxide, which is favorable for the formation of high performance semiconductor devices on the semiconductor structure.

In one embodiment, a material of the semiconductor substrate 100 may comprise single crystal Si, single crystal SiGe and single crystal Ge.

In one embodiment, the material of the insulation oxide layer 201 contacted with the semiconductor substrate 100 may be any one of beryllium oxide, $SiO_2$, $SiO_xN_y$ and a combination thereof in a single-crystal or amorphous state, so as to form a SOI (semiconductor-on-insulator) structure with the semiconductor substrate 100, the insulation oxide layer 201 and the single crystal semiconductor layer 301. The material of insulation oxide layers 202 . . . 20x is the single crystal beryllium oxide. Because both a beryllium oxide crystal and a conventional semiconductor material (such as Si, Ge, SiGe or GaAs) belong to a cubic system, meanwhile, a lattice constant of the single crystal silicon is expressed as a=b=5.43 Å, and a lattice constant of the single crystal beryllium oxide is expressed as a=b=2.70 Å which is about half of that of the single crystal silicon, that is, one unit cell of silicon crystal just matches with two unit cells of beryllium oxide crystal. Thus silicon crystal and beryllium oxide crystal substantially lattice match with each other, which may obviously reduce a crystal defect in the semiconductor structure, and is helpful to form the semiconductor single crystal film on the single crystal beryllium oxide film by epitaxial growth, as well as to form the single crystal beryllium oxide film on the semiconductor single crystal film by epitaxial growth. Furthermore, it is favorable for a formation of high performance semiconductor devices on the semiconductor structure. Particularly, the high quality Si film may be formed on the single crystal beryllium oxide by epitaxial growth, as well as the single crystal beryllium oxide film may be formed on the single crystal Si film by epitaxial growth, so as to further form a three dimensional Si device with high performance.

It should be noted that in order to ensure an insulation property of the beryllium oxide layers and to avoid an influence of high dielectric constant thereof, a thickness of each insulation oxide layer is not less than 25 nm. Preferably, the thickness of each insulation oxide layer is not less than 200 nm.

The material of single crystal semiconductor layers 301, 302 . . . 30x may comprise any one of Si, Ge, SiGe, groups III-V compound semiconductor materials, and groups II-VI compound semiconductor materials and a combination thereof. Although compared with Si, Ge and groups III-V and II-VI compound semiconductor materials relatively poorly lattice match with beryllium oxide, high quality single crystal semiconductor layers with the material of Ge or groups III-V or groups II-VI compound semiconductor may be still obtained by an epitaxial structure or a process optimization. For example, a threading dislocation density may be suppressed by increasing a thickness of the semiconductor film, or by firstly epitaxially growing the Si film on the beryllium oxide film, and then epitaxially growing Ge or groups III-V or groups II-VI compound semiconductor film on the Si film. It should be noted that, each single crystal semiconductor layer may comprise one or more sub-layers (such as a quantum well structure Si/SiGe/Si). Each single crystal semiconductor layer may be identical in material, or at least one single crystal semiconductor layer is different from other single crystal semiconductor layers in material. In a preferred embodiment, the material of the insulation oxide layer 201 is single crystal beryllium oxide, and the insulation oxide layers 201, 202 . . . 20x and the single crystal semiconductor layers 301, 302 . . . 30x may be formed by epitaxial growth so as to obtain high quality and low defect oxide films and semiconductor films. For instance, with $Be(CH_3)_2$ and $H_2O$ vapour as reaction precursors, the beryllium oxide is grown by ALD at a temperature of 150-450° C. (250° C. is preferred) for 740 cycles. The beryllium oxide film with a thickness of 200 nm is formed with a reaction formula: $3Be(CH_3)_2+3H_2O=3BeO+6CH_4\uparrow$. In another embodiment, the insulation oxide layers 201, 202 . . . 20x and the single crystal semiconductor layers 301, 302 . . . 30x may be formed by a conventional deposition method (such as an ultra-high vacuum chemical vapor deposition (UHVCVD), a metal-organic chemical vapor deposition (MOCVD), or a molecular beam epitaxy (MBE)).

In one embodiment, a surface of the semiconductor substrate 100 may be a crystal plane of (100), (110) or (111). In general, a surface crystal plane index of each insulation oxide crystal layer may be identical to that of the semiconductor substrate 100. For instance, when the surface crystal plane index of the semiconductor substrate 100 is (100), the surface crystal plane index of each insulation oxide layer may be (100), and accordingly, the surface crystal plane index of each single crystal semiconductor layer may be also (100). In one embodiment, by using Si with the surface crystal plane of (100) as the semiconductor substrate 100, the beryllium oxide layer with the surface crystal plane of (100) and the single crystal Si semiconductor layer with the surface crystal plane of (100) are alternately epitaxially grown on the semiconductor substrate 100. Because the lattice constant of Si much approaches twice of that of beryllium oxide, the semiconductor structure of alternate high quality single crystal beryllium oxide layer and single crystal Si semiconductor layer is formed. Such semiconductor structure is useful for fabricating a three dimensional NAND flash device.

In one embodiment, since except the insulation oxide layer contacted with the semiconductor substrate, other insulation oxide layers are confirmed as single crystal beryllium oxide layers, the material of the single crystal semiconductor layer formed on the single crystal beryllium oxide layer may be non-strained Si, compressively strained SiGe, tensilely strained $Si_{1-y}C_y$ ($0 \leq y \leq 1$, where C is a substitution atom rather than an interstitial atom), or relaxed Ge or GaAs. By designing a composition and adjusting a content of each single crystal semiconductor film, a minor lattice mismatch between the single crystal semiconductor film and the single crystal beryllium oxide layer is thus generated so as to enable each single crystal semiconductor film with a specific type and degree of strain. The strained semiconductor layer is helpful to improve a carrier mobility of a channel. For instance, the tensile stress is helpful to increase an electron mobility for the NMOSFET, while the compressive stress is helpful to increase the hole mobility for the PMOSFET. For instance, when a SiGe film is grown on the beryllium oxide crystal, because an atomic radius of Ge is bigger than that of Si, the SiGe film with a compressive strain of which the strain increasing with an increase of Ge content may be obtained and is applicable for fabricating the PMOSFET device; when a $Si_{1-y}C_y$ ($0 \leq y \leq 1$, where C is a substitution atom rather than an interstitial atom) film is grown on the beryllium oxide crystal, because an atomic radius of C is smaller than that of Si, the $Si_{1-y}C_y$ film with a tensile strain of which the strain increasing with an increase of C content may be obtained and is applicable for fabricating the NMOSFET device. Furthermore, in some embodiments, at least one single crystal semiconductor layer is different from other single crystal semiconductor layers in type of strain, in which the single crystal semiconductor layer with the tensile strain may be used for fabricating the NMOSFET device, and the single crystal semiconductor layer with the compressive strain may be used for fabricating the PMOSFET device. In another embodiment, at least one single crystal semiconductor layer is different from other single crystal semiconductor layers in degree of strain, in which a low strained single crystal semiconductor layer may be used for fabricating a memory device, and a high strained single crystal semiconductor layer with a high carrier mobility may be used for fabricating a logic device.

For a better explanation of an application of the strained single crystal semiconductor layer according to an embodiment of the present disclosure, a further example is described as follows.

Figure 2:
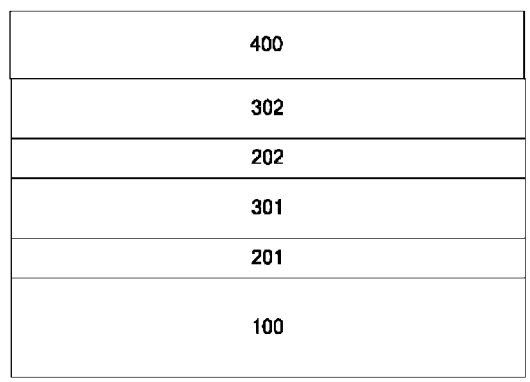
FIG. 2 is a cross-sectional view of a semiconductor structure with beryllium oxide according to another embodiment of the present disclosure.

As shown in FIG. 2, the semiconductor structure according to this embodiment from bottom to up comprises: a semiconductor substrate 100; a first insulation oxide layer 201; a first single crystal semiconductor layer 301; a second insulation oxide layer 202; a second single crystal semiconductor layer 302; and an up passivation layer 400. A material of the semiconductor substrate 100 is Si with the surface crystal plane of (100), and a material of the surface passivation layer 400 is Si or nitride, etc, depending on a material of the second single crystal semiconductor layer 302.

In one embodiment, materials of the first insulation oxide layer 201 and the second insulation oxide layer 202 are single crystal beryllium oxide, whose lattice constant matches with that of the substrate 100 (the lattice constant of single crystal beryllium oxide is approximately half of that of Si), a material of the first single crystal semiconductor layer 301 is strained $Si_{1-y}C_y$ ($0 \leq y \leq 1$, where C is a substitution atom rather than an interstitial atom), a material of the second single crystal semiconductor layer 302 is strained $Si_{1-y}Ge_y$ ($0 \leq y \leq 1$), and the material of the surface passivation layer 400 is Si to enable the material surface stable. In this embodiment, because an atomic radius of C is smaller than that of Si, and an atomic radius of Ge is bigger than that of Si, the first single crystal semiconductor layer 301 (strained $Si_{1-y}C_y$ layer) is tensilely strained and has a high electron mobility for fabricating NMOSFET devices, and the second single crystal semiconductor layer 302 (strained $Si_{1-y}Ge_y$ layer) is compressively strained and has a high hole mobility for fabricating PMOSFET devices, that is, two single crystal semiconductor layers with different types of strain are used for fabricating different types of devices.

In another embodiment, materials of the first insulation oxide layer 201 and the second insulation oxide layer 202 are single crystal beryllium oxide, whose lattice constant matches with that of the substrate 100 (the lattice constant of single crystal beryllium oxide is approximately half of that of Si), a material of the first single crystal semiconductor layer 301 is Si, a material of the second single crystal semiconductor layer 302 is strained $Si_{1-y}Ge_y$ ($0 \leq y \leq 1$), and the material of the surface passivation layer 400 is Si to enable the material surface stable. In this embodiment, because an atomic radius of Ge is bigger than that of Si, and Ge is contained in the second single crystal semiconductor layer 302, the first single crystal semiconductor layer 301 (Si layer) is not strained, and the second single crystal semiconductor layer 302 (strained $Si_{1-y}Ge_y$ layer) is compressively strained, that is, two single crystal semiconductor layers have different degrees of strain. The non-strained first single crystal semiconductor layer 301 (Si layer) may be used for fabricating NMOSFET devices, and the compressively strained second single crystal semiconductor layer 302 (strained $Si_{1-y}Ge_y$ layer) may be used for fabricating PMOSFET devices.

In another embodiment, materials of the first insulation oxide layer 201 and the second insulation oxide layer 202 are single crystal beryllium oxide. The lattice constant of each insulation oxide layer matches with that of the substrate 100 (the lattice constant of each insulation oxide layer is approximately half of that of Si). A material of the first single crystal semiconductor layer 301 is relaxed Si, a material of the second single crystal semiconductor layer 302 is relaxed Ge, and the material of the surface passivation layer 400 is non-crystalline $Si_3N_4$ to enable the material surface stable. With the multi-layer complex structure, the second single crystal semiconductor layer 302 (Ge layer) may be used for fabricating a Ge detector, and the first single crystal semiconductor layer 301 (Si layer) may be used for fabricating a MOSFET device which may form a control circuit for controlling the Ge detector so as to realize a three dimensional integration of the Ge detector and the control circuit.

It should be noted that, in above three embodiments, the degree of strain of each single crystal semiconductor layer may be further adjusted by adjusting the content thereof. For instance, for the compressively strained $Si_{1-y}Ge_y$ layer, when reducing the content of Ge, its strain is reduced accordingly.

The semiconductor structure with beryllium oxide is provided according to embodiments of the present disclosure. By alternately stacking the plurality of insulation dielectric layers and the plurality of single crystal semiconductor layers, because the single crystal semiconductor and the single crystal beryllium oxide lattice match with each other, the crystal defect in the semiconductor structure may be obviously reduced, which is favorable for a formation of high performance and high integration density three dimensional semiconductor devices on the semiconductor structure. It is not only to greatly increase the integration density of the device, but also to realize the three dimensional integration with different devices. Moreover, because the heat conductivity of the single crystal beryllium oxide is larger than that of the conventional oxide (such as $SiO_2$ or $SiO_xN_y$), the heat dissipation of devices can be evidently improved and the device performance can be enhanced accordingly. In addition, processes for fabricating the semiconductor structure are compatible with conventional semiconductor fabrication processes, and simple to realize with low cost.

Reference throughout this specification to "an embodiment", "some embodiments", "one embodiment", "an example", "a specific example", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "in an example", "in a specific example", or "in some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor structure with beryllium oxide, comprising:
   a semiconductor substrate; and
   a plurality of insulation oxide layers and a plurality of single crystal semiconductor layers alternately stacked on the semiconductor substrate,
   wherein
   a material of the insulation oxide layer contacted with the semiconductor substrate is any one of $SiO_2$, $SiO_xN_y$ and a combination thereof, a material of other insulation oxide layers is single crystal beryllium oxide, and a thickness of each of the other insulation oxide layers is not less than 25 nm;
   at least one single crystal semiconductor layer is strained; and
   at least one single crystal semiconductor layer is different from other single crystal semiconductor layers in type of strain.

2. The semiconductor structure according to claim 1, wherein a material of the semiconductor substrate comprises any one of single crystal Si, single crystal SiGe and single crystal Ge.

3. The semiconductor structure according to claim 1, wherein a material of each single crystal semiconductor layer comprises any one of Si, Ge, SiGe, groups III-V compound semiconductor materials, and groups II-VI compound semiconductor materials and a combination thereof.

4. The semiconductor structure according to claim 1, wherein each single crystal semiconductor layer comprises one or more sub-layers.

5. The semiconductor structure according to claim 1, wherein at least one single crystal semiconductor layer is different from other single crystal semiconductor layers in material.

6. The semiconductor structure according to claim 1, wherein at least one single crystal semiconductor layer is different from other single crystal semiconductor layers in degree of strain.

7. The semiconductor structure according to claim 1, wherein a surface of the semiconductor substrate is any crystal plane of (100), (110) and (111).

8. The semiconductor structure according to claim 1, wherein each of the other insulation oxide layers and each single crystal semiconductor layer are formed by epitaxial growth.

\* \* \* \* \*